(12) United States Patent
Sun et al.

(10) Patent No.: US 9,987,836 B2
(45) Date of Patent: Jun. 5, 2018

(54) METHOD AND DEVICE FOR REMOVING INTEGRATED CIRCUITS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yong Sun, Beijing (CN); Xianzhen Tang, Beijing (CN); Zhiyu Qian, Beijing (CN); Long Yan, Beijing (CN); Jun Zhang, Beijing (CN); Daocheng Zhu, Beijing (CN); Wei Wang, Beijing (CN)

(73) Assignees: BOE TECHNOLOGY GROUP CO., LTD. (CN); HEFEI XINSHENG OPTOELECTRONICS TECHNOLOGY CO., LTD. (CN)

(*) Notice: Subject to any disclaimer, the term of this patent is extended or adjusted under 35 U.S.C. 154(b) by 287 days.

(21) Appl. No.: 14/742,820

(22) Filed: Jun. 18, 2015

(65) Prior Publication Data

US 2016/0198599 A1     Jul. 7, 2016

(30) Foreign Application Priority Data

Jan. 4, 2015   (CN) .......................... 2015 1 0001238

(51) Int. Cl.
*B32B 43/00*       (2006.01)
*B32B 38/10*       (2006.01)
(Continued)

(52) U.S. Cl.
CPC .............. *B32B 43/006* (2013.01); *B32B 3/10* (2013.01); *B32B 7/00* (2013.01); *B32B 7/04* (2013.01);
(Continued)

(58) Field of Classification Search
CPC .... B32B 3/10; B32B 7/00; B32B 7/04; B32B 7/06; B32B 7/12; B32B 37/12;
(Continued)

(56) References Cited

U.S. PATENT DOCUMENTS 5,256,562 A * 10/1993 Vu .......................... A61B 3/113
257/E21.614
5,753,133 A *  5/1998 Wong ................ H01L 21/68742
118/503
(Continued)

FOREIGN PATENT DOCUMENTS

CN          2890984 Y     4/2007
CN        101144924 A     3/2008
(Continued)

OTHER PUBLICATIONS

Office Action in Chinese Patent Application No. 201510001238.0, dated Nov. 28, 2016.

*Primary Examiner* — Carl Arbes
(74) *Attorney, Agent, or Firm* — Brooks Kushman P.C.

(57) ABSTRACT

The present disclosure provides a method and device for removing an integrated circuit. The device is used to remove the integrated circuit from a display panel. The device includes a heating unit configured to contact and heat the display panel, and a retractable clamping-taking component configured to clamp and take the integrated circuit on the display panel which has been heated. According to embodiments of the present disclosure, the method and device may remove the integrated circuit from the display panel without destroying the display panel and increase efficiency of removing the integrated circuit.

15 Claims, 1 Drawing Sheet

(51) Int. Cl.

| | |
|---|---|
| *H01L 21/77* | (2017.01) |
| *B32B 7/00* | (2006.01) |
| *B32B 3/10* | (2006.01) |
| *H01L 21/302* | (2006.01) |
| *B32B 7/12* | (2006.01) |
| *H01L 21/44* | (2006.01) |
| *B32B 7/06* | (2006.01) |
| *B32B 37/12* | (2006.01) |
| *B32B 7/04* | (2006.01) |
| *H01L 21/70* | (2006.01) |

(52) U.S. Cl.
CPC . *B32B 7/06* (2013.01); *B32B 7/12* (2013.01); *B32B 37/12* (2013.01); *B32B 38/10* (2013.01); *B32B 2457/20* (2013.01); *H01L 21/302* (2013.01); *H01L 21/44* (2013.01); *H01L 21/70* (2013.01); *H01L 21/77* (2013.01)

(58) Field of Classification Search
CPC ... B32B 38/10; B32B 43/006; B32B 2457/20; H01L 21/44; H01L 21/70; H01L 21/77; H01L 21/302
See application file for complete search history.

(56) References Cited

U.S. PATENT DOCUMENTS

| | | | | |
|---|---|---|---|---|
| 6,027,958 | A * | 2/2000 | Vu | H01L 21/568 257/679 |
| 6,318,384 | B1 * | 11/2001 | Khan | H01L 21/3065 134/1.1 |
| 6,860,965 | B1 * | 3/2005 | Stevens | C23C 14/566 118/719 |
| 6,977,014 | B1 * | 12/2005 | Stevens | H01L 21/67017 118/719 |
| 8,715,802 | B2 * | 5/2014 | Tsai | H01L 21/6835 156/247 |
| 2007/0091062 | A1 * | 4/2007 | French | G02F 1/133305 345/107 |

FOREIGN PATENT DOCUMENTS

| | | |
|---|---|---|
| CN | 104216154 A | 12/2014 |
| JP | H06-112272 A | 4/1994 |
| KR | 10-0543024 B1 | 1/2006 |

\* cited by examiner

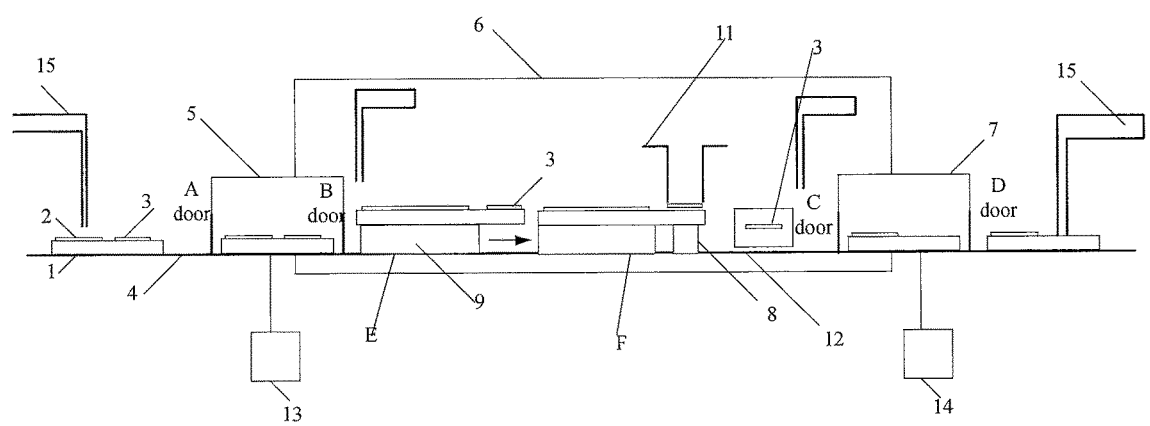

METHOD AND DEVICE FOR REMOVING INTEGRATED CIRCUITS

CROSS-REFERENCE TO RELATED APPLICATION

This application claims a priority to Chinese Patent Application No. 201510001238.0 filed on Jan. 4, 2015, the disclosure of which is incorporated in its entirety by reference herein.

TECHNICAL FIELD

The present disclosure relates to the field of display technology, in particular to a method and device for removing integrated circuits.

BACKGROUND

With the large-scale development of mobile products, such as a smartphone, a tablet computer and an ultrabook, requirements for miniaturization and thinness of liquid crystal display modules are increasingly high. A chip on glass (COG) product is of a simple structure, which may greatly reduce a volume of the liquid crystal display module and may be easy to achieve a mass-production. At present, in order to further reduce cost, liquid crystal display modules in mobile products of small sizes are usually manufactured through the COG process, i.e., a drive integrated circuit (IC) is directly bonded to a display panel using anisotropic conductive adhesive (ACF).

During practical process of manufacturing the liquid crystal display modules and analyzing, it is likely to have a poor IC bonding resulted from mixing of IC raw materials, shifting of bonding, poor crimping of bonding, etc., which needs to be repaired by bonding the IC again after being removed. On the other hand, when testing and analyzing the display panel, it is required to remove the IC to expose a signal lead of a corresponding electrode region.

According to a typical method for removing the IC, a surface of the IC is heated up to a temperature of 300 Celsius degrees to 450 Celsius degrees for a while by a hot air gun, and then the IC is peeled off from the liquid crystal display module by using a hard object. However, such method has following disadvantages: since the hot air gun cannot contact the IC directly, i.e., there exists a certain gap between the hot air gun and the IC, thus it takes a relative long time to heat the IC to a desired temperature. As a result, the efficiency is low, and the IC cannot be removed on a large-scale. Besides, when using the hard object to peel off the IC, it is easy to scratch the electrode region of the display panel due to an inappropriate operation, which may even cause a fracture of the electrode region of the display panel, thereby adversely affecting display, test and analysis of the display panel.

SUMMARY

An object of the present disclosure is to provide a method and device for removing an integrated circuit, which can remove the integrated circuit from a display panel without destroying the display panel and increase efficiency of removing the integrated circuit.

In one aspect, the present disclosure provide in one embodiment a device for removing an integrated circuit, configured to remove the integrated circuit from a display panel, the device including a heating unit configured to contact and heat the display panel, and a retractable clamping-taking component configured to clamp and take the integrated circuit on the display panel which has been heated.

Further, the device further includes a supporting unit configured to support and fix the display panel.

Further, the device further includes an integrated circuit recovery unit for accommodating removed integrated circuits.

Further, the heating unit includes a heating plate, and a temperature controller configured to control a temperature of the heating plate.

Further, the heating plate is made of stainless steel, silicon or ceramic.

Further, the retractable clamping-taking component includes two clamping bars opposite arranged, and a distance controller configured to control a distance between the two clamping bars.

Further, the supporting unit includes a placing platform for supporting the display panel, and a fixing part located at the placing platform and configured to fix the display panel.

Further, the device further includes an operating chamber; the heating unit and the retractable clamping-taking component are located in the operating chamber.

Further, the operating chamber is a vacuum chamber.

Further, the device further includes a first transition chamber located at one side of the operating chamber and adjacent to the operating chamber; a first vacuum-pumping unit configured to vacuumize the first transition chamber; a second transition chamber located at the other side of the operating chamber and adjacent to the operating chamber; and a second vacuum-pumping unit configured to vacuumize the second transition chamber.

Further, the device further includes a conveyor configured to transfer the display panel from the first transition chamber to the second transition chamber through the operating chamber; and a manipulator configured to take and place the display panel onto the conveyor.

The present disclosure provides in one embodiment a method for removing an integrated circuit by using the above-mentioned device. The method includes heating a display panel by a heating unit of the device; and clamping and taking, by a retractable clamping-taking component of the device, the integrated circuit on the display panel which is heated.

Further, the device further includes a supporting unit configured to support and fix the display panel; the clamping and taking, by a retractable clamping-taking component of the device, the integrated circuit on the display panel which is heated includes fixing the display panel by the supporting unit of the device, and clamping and taking, by the retractable clamping-taking component, the integrated circuit on the display panel which is heated.

Further, the heating unit includes a heating plate; the heating a display panel by a heating unit of the device includes directly contacting the heating plate with a region of the display panel corresponding to the integrated circuit in such a manner that the heating plate and the integrated circuit are located at two opposite sides of the display panel.

Further, the device further includes an integrated circuit recovery unit for accommodating removed integrated circuits; after the clamping and taking, by a retractable clamping-taking component of the device, the integrated circuit on the display panel which is heated, the method further includes placing the removed integrate circuit to the integrated circuit recovery unit.

The present disclosure further provides in one embodiment a method for removing an integrated circuit by using the above-mentioned device. The method includes:

taking and placing a display panel onto a conveyor of the device by a manipulator of the device, and transferring the display panel to a first transition chamber of the device by the conveyor;

vacuumizing the first transition chamber by a first vacuum-pumping unit of the device, and transferring the display panel to an operating chamber of the device from the first transition chamber when a vacuum degree of the first transition chamber is identical to that of the operating chamber;

placing the display panel onto a supporting unit of the device by the manipulator, heating the display panel by a heating unit of the device, and clamping and taking the integrated circuit on the display panel which has been heated by a retractable clamping-taking component of the device;

vacuumizing the second transition chamber by a second vacuum-pumping unit of the device, taking the display panel from the supporting unit to the conveyor by the manipulator and transferring the display panel to a second transition chamber from the operating chamber by the conveyor when a vacuum degree of the second transition chamber is identical to that of the operating chamber; and transferring the display panel out of the second transition chamber.

Further, the heating unit includes a heating plate; the heating the display panel by a heating unit of the device includes: directly contacting the heating plate with a region of the display panel corresponding to the integrated circuit in such a manner that the heating plate and the integrated circuit are located at two opposite sides of the display panel.

Embodiments of the present disclosure have follow advantages. In the present embodiment, when heating the display panel, the heating unit contacts the display panel, thereby to improve efficiency of heating the display panel. After the display panel has been heated, the display panel is fixed and the integrated circuit on the display panel is removed by the clamping-taking component. The technical solution of the present disclosure can rapidly and efficiently remove the integrated circuit from the display panel and effectively prevent the display panel from being damaged when removing the integrated circuit.

BRIEF DESCRIPTION OF THE DRAWINGS

FIG. 1 is a schematic view showing a device for removing an integrated circuit according to one embodiment of the present disclosure.

DETAILED DESCRIPTION

In order to make the technical problems to be solved, the technical solutions and the advantages of the present disclosure more apparent, the present disclosure will be described hereinafter in conjunction with the drawings and the embodiments.

The present disclosure provides in embodiments a method and device for removing an integrated circuit, which can remove the integrated circuit from a display panel without destroying the display panel and increase efficiency of removing the integrated circuit.

The present disclosure provides in one embodiment a device for removing an integrated circuit, which is used to remove the integrated circuit from a display panel. The device includes a heating unit configured to contact and heat the display panel, and a retractable clamping-taking component configured to clamp and take the integrated circuit on the display panel after the display panel has been heated.

In the present embodiment, when heating the display panel, the heating unit contacts the display panel, thereby to improve efficiency of heating the display panel. After the display panel has been heated, the display panel is fixed and the integrated circuit on the display panel is removed by the clamping-taking component. The technical solution of the present disclosure can rapidly and efficiently remove the integrated circuit from the display panel and effectively prevent the display panel from being damaged when removing the integrated circuit.

Further, the device further includes a supporting unit configured to support and fix the display panel. Thus, when removing the integrated circuit, the display panel which has been heated is fixed by the supporting unit, and then the integrated circuit on the display panel is clamped and taken by the retractable clamping-taking component.

Further, the device further includes an integrated circuit recovery unit configured to accommodate the removed integrated circuit.

Further, the heating unit includes a heating plate and a temperature controller configured to control a temperature of the heating plate.

Specifically, the heating plate may be made of a material having a good thermal conductivity, such as stainless steel, silicon or ceramic.

Further, the retractable clamping-taking component includes two clamping bars opposite arranged, and a distance controller configured to control a distance between the two clamping bars. The distance controller may adjust the distance between the two clamping bars in accordance with a size of the integrated circuit to be clamped and taken, so as to make the distance between the two clamping bars match the size of the integrated circuit.

Further, the supporting unit includes a placing platform for supporting the display panel, and a fixing part located at the placing platform and configured to fix the display panel.

Further, the device further includes an operating chamber. The heating unit and the retractable clamping-taking component are located in the operating chamber.

Alternatively, the operating chamber is a vacuum chamber. Since heat is not easily dissipated in a vacuum environment, thus the vacuum chamber may have heat insulation effect, which helps to shorten heating time.

Further, in order to guarantee the vacuum environment in the operating chamber, the device further includes a first transition chamber, a first vacuum-pumping unit, a second transition chamber and a second vacuum-pumping unit. The first transition chamber is located at one side of the operating chamber and adjacent to the operating chamber. The first vacuum-pumping unit is configured to vacuumize the first transition chamber. The second transition chamber is located at the other side of the operating chamber and adjacent to the operating chamber. The second vacuum-pumping unit is configured to vacuumize the second transition chamber.

Further, the device further includes a conveyor and a manipulator. The conveyor is configured to transfer the display panel from the first transition chamber to the second transition chamber through the operating chamber. The manipulator is configured to take the display panel and place the display panel onto the conveyor.

The present disclosure further provides in one embodiment a method for removing an integrated circuit, which may be applied to the above-mentioned device. The method includes heating a display panel by the heating unit, and clamping and taking, by the retractable clamping-taking component, the integrated circuit on the display panel which has been heated.

In the present embodiment, when heating the display panel, the heating unit contacts the display panel, thereby to improve efficiency of heating the display panel. After the display panel has been heated, the display panel is fixed and the integrated circuit on the display panel is removed by the clamping-taking component. The technical solution of the present disclosure may rapidly and efficiently remove the integrated circuit from the display panel and effectively prevent the display panel from being damaged when removing the integrated circuit.

Further, the step of clamping and taking, by the retractable clamping-taking component, the integrated circuit on the display panel which has been heated includes: fixing the display panel by the supporting unit, and clamping and taking, by the retractable clamping-taking component, the integrated circuit on the display panel which has been heated.

Further, after the step of clamping and taking, by the retractable clamping-taking component, the integrated circuit on the display panel which has been heated, the method further includes placing the removed integrated circuit in the integrated circuit recovery unit.

Further, the method specifically includes:

taking and placing, by the manipulator, the display panel onto the conveyor, and transferring the display panel to the first transition chamber by the conveyor;

vacuumizing the first transition chamber by the first vacuum-pumping unit, and transferring the display panel to the operating chamber from the first transition chamber when a vacuum degree of the first transition chamber is identical to that of the operating chamber;

placing the display panel onto the supporting unit by the manipulator, heating the display panel by the heating unit, and clamping and taking, by the retractable clamping-taking component, the integrated circuit on the display panel which has been heated;

vacuumizing the second transition chamber by the second vacuum-pumping unit, taking the display panel from the supporting unit and placing the display panel onto the conveyor by the manipulator when a vacuum degree of the second transition chamber is identical to that of the operating chamber, and transferring the display panel to the second transition chamber from the operating chamber by the conveyor; and transferring the display panel out of the second transition chamber.

The device and method for removing the integrated circuit according to embodiments of the present disclosure will be further described in conjunction with the following drawing.

As shown in FIG. 1, in one embodiment of the present disclosure, a device for removing integrated circuits includes a first transition chamber 5, an operating chamber 6, a second transition chamber 7, a conveyor 4 configured to transfer the display panel 1 from the first transition chamber 5 to the second transition chamber 7 through the operating chamber 6, and a manipulator 15 configured to place the display panel 1 onto the conveyor 4 or take the display panel 1 from the conveyor 4. The manipulator 15 is provided with a suction ball for sucking the display panel 1.

The operating chamber 6 is provided with a heating unit 8 for heating the display panel 1, a supporting unit for supporting and fixing the display panel, a retractable clamping-taking component 11 for clamping and taking an integrated circuit 3 on the display panel, and an integrated circuit recovery unit 12 for accommodating removed integrated circuits. The heating unit 8 includes a heating plate and a temperature controller for controlling a temperature of the heating plate. The heating plate may be made of a material having a good thermal conductivity, such as stainless steel, silicon or ceramic. The supporting unit includes a placing platform 9 for supporting the display panel 1. Specifically, the placing platform 9 may be a vacuum suction platform. The retractable clamping-taking component 11 includes two clamping bars opposite arranged and a distance controller for controlling a distance between the two clamping bars. The distance between the two clamping bars may be adjusted in accordance with a size of the integrated circuit to be clamped and taken. The retractable clamping-taking component 11 may be moved, stretched or contracted in accordance with a position and a size of the integrated circuit 3 at the display panel 1.

Since heat is not easily dissipated in a vacuum environment, thus the operating chamber 6 is a vacuum chamber, which may have heat insulation effect and help to shorten heating time. In addition, in order to guarantee the vacuum environment in the operating chamber 6, the first transition chamber 5 and the second transition chamber 7 are arranged at two sides of the operating chamber 6, respectively. The first transition chamber 5 includes a door A through which the display panel 1 is transferred into the first transition chamber 5, and a door B through which the display panel 1 is transferred out of the first transition chamber 5. The first transition chamber 5 is connected to a first vacuum-pumping unit 13 for vacuumizing the first transition chamber 5. The second transition chamber 7 includes a door C through which the display panel 1 is transferred into the second transition chamber 7 and a door D through which the display panel is transferred out of the second transition chamber 7. The second transition chamber 7 is connected to a second vacuum-pumping unit 14 for vacuumizing the second transition chamber 7.

During operation, the display panel 1 provided with a printed circuit board 2 and the integrated circuit 3 is placed onto the conveyor 4 by the manipulator 15. The display panel 1 is transferred to the first transition chamber 5 by the conveyor 4. When the door A is open, the display panel 1 enters into the first transition chamber 5. After the door A is closed, the first transition chamber 5 is vacuumized by the first vaccumizing unit 13. When a vacuum degree of the first transition chamber 5 is identical to a vacuum degree of the operating chamber 6, the door B is opened and the display panel 1 enters into the operating chamber 6. The display panel 1 is taken from the conveyor 4 and placed onto the placing platform 9 by the manipulator 15. The display panel 1 is fixed at the placing platform 9. As can be seen from FIG. 1, a region of the display panel 1 corresponding to the integrated circuit 3 is located outside the placing platform 9. When the placing platform 9 is moved from a position E to a position F, the heating unit 8 is elevated so that the heating plate contacts the region of the display panel 1 corresponding to the integrated circuit 3 and heats the display panel 1. The temperature of the heating plate may be adjusted by the temperature controller according to needs. The heating plate may be replaced in accordance with the size of the display panel. When heating to an appropriate temperature, an anisotropic conductive adhesive (ACF) for bonding the integrated circuit 3 is melted. The retractable clamping-taking component 11 clamps the integrated circuit 3 on the display panel 1, and then the integrated circuit 3 is removed from the display panel 1 under an upward force of the retractable clamping-taking component 11. The heating unit 8 is lowered, and then the placing platform 9 is moved forward. Since the retractable clamping-taking component 11 is movable, thus a plurality of integrated circuits 3 may be removed from the display panel 1. The removed integrated circuit 3 is placed in the integrated circuit recovery unit 12 by the retractable clamping-taking component 11. The integrated circuit recovery unit 12 is not located at a path along which the placing platform 9 is moved. Since it is hard to reuse the removed integrated circuit 3, thus only one recovery unit is arranged. If the integrated circuits for a gate electrode and a source electrode need to be placed separately, it only requires one additional recovery unit and a correspondingly-changed process. After the integrated circuit 3 is removed, the display panel 1 is taken from the placing platform 9 and placed onto the conveyor 4 by the manipulator 15. The second transition chamber 7 is vacuumized by the second vacuum-pumping unit 14. The door C is opened when a vacuum degree of the second transition chamber 7 is identical to that of the operating chamber 6, and the display panel 1 without the integrated circuit 3 is transferred into the second transition chamber 7 from the operating chamber 6 by the conveyor 4. Then the door C is closed and the door D is opened, the display panel 1 is transferred out of the second transition chamber 7, and then the door D is closed. After that, the display panel 1 is sucked from the conveyor 4 by the manipulator 15 so as to perform subsequent processes as required.

The device for removing the integrated circuit according to embodiments of the present disclosure is of a simple structure and is easy to be achieved. When heating the display panel, the heating plate contacts the display panel, thereby to improve efficiency of heating the display panel. After the display panel is heated, the display panel is fixed and the integrated circuit on the display panel is removed by the clamping-taking component. The technical solution of the present disclosure can rapidly and efficiently remove the integrated circuit from the display panel, and effectively prevent the display panel from being damaged when removing the integrated circuit.

The above are merely preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A device for removing an integrated circuit, configured to remove the integrated circuit from a display panel, the device comprising:
   a heating unit, configured to contact and heat the display panel;
   a retractable clamping-taking component, configured to clamp and take the integrated circuit on the display panel which is heated by the heating unit; and
   an operating chamber that is a vacuum chamber, wherein the heating unit and the retractable clamping-taking component are located in the operating chamber.

2. The device according to claim 1, further comprising a supporting unit, configured to support and fix the display panel when the integrated circuit is clamped and taken by the retractable clamping-taking component.

3. The device according to claim 1, further comprising an integrated circuit recovery unit configured to accommodate the integrated circuit removed by the retractable clamping-taking component.

4. The device according to claim 1, wherein the heating unit comprises:
   a heating plate, configured to directly contact the display panel and heat the display panel; and
   a temperature controller, configured to control a temperature of the heating plate.

5. The device according to claim 4, wherein the heating plate is made of stainless steel, silicon or ceramic.

6. The device according to claim 1, wherein the retractable clamping-taking component comprises:
   two clamping bars oppositely arranged, configured to clamp and take the integrated circuit; and
   a distance controller, configured to control a distance between the two clamping bars.

7. The device according to claim 2, wherein the supporting unit comprises:
   a placing platform for supporting the display panel; and
   a fixing part, located at the placing platform and configured to fix the display panel.

8. The device according to claim 1, further comprising:
   a first transition chamber, located at one side of the operating chamber and adjacent to the operating chamber, and configured to accommodate the display panel before the display panel is heated by the heating unit;
   a first vacuum-pumping unit, configured to vacuumize the first transition chamber;
   a second transition chamber, located at the other side of the operating chamber and adjacent to the operating chamber, and configured to accommodate the display panel after the display panel is heated by the heating unit; and
   a second vacuum-pumping unit, configured to vacuumize the second transition chamber.

9. The device according to claim 8, further comprising:
   a conveyor configured to transfer the display panel from the first transition chamber to the second transition chamber through the operating chamber; and
   a manipulator configured to take the display panel and place the display panel onto the conveyor.

10. A method for removing an integrated circuit by using the device according to claim 1, the method comprising:
    heating a display panel by the heating unit of the device; and
    clamping and taking, by the retractable clamping-taking component of the device, the integrated circuit on the display panel which has been heated the heating unit.

11. The method according to claim 10, wherein the device further comprises a supporting unit configured to support and fix the display panel when the integrated circuit is clamped and taken by the retractable clamping-taking component;
    the clamping and taking, by the retractable clamping-taking component of the device, the integrated circuit on the display panel which has been heated by the heating unit comprises:
    fixing the display panel by the supporting unit of the device; and
    clamping and taking, by the retractable clamping-taking component, the integrated circuit on the display panel which has been heated.

12. The method according to claim 11, wherein the heating unit comprises a heating plate;
    the heating a display panel by a heating unit of the device comprises:
    directly contacting the heating plate with a region of the display panel corresponding to the integrated circuit in such a manner that the heating plate and the integrated circuit are located at two opposite sides of the display panel.

13. The method according to claim 10, wherein the device further comprises an integrated circuit recovery unit for accommodating the integrated circuits removed by the retractable clamping-taking component;
    after the clamping and taking, by the retractable clamping-taking component of the device, the integrated circuit on the display panel which has been heated is placed, the method further comprises:
    placing the removed integrate circuit into the integrated circuit recovery unit.

14. A method for removing an integrated circuit by using the device according to claim 9, the method comprising:
    taking and placing a display panel onto the conveyor of the device by the manipulator of the device, and transferring the display panel to a to the first transition chamber of the device by the conveyor;
    vacuumizing the first transition chamber by the first vacuum-pumping unit of the device, and transferring the display panel to the operating chamber of the device from the first transition chamber when a vacuum degree of the first transition chamber is identical to that of the operating chamber;
    placing the display panel onto a supporting unit of the device by the manipulator, heating the display panel by the heating unit of the device, and clamping and taking, by a retractable clamping-taking component of the device, the integrated circuit on the display panel which has been heated by the heating unit;
    vacuumizing the second transition chamber by the second vacuum-pumping unit of the device, taking the display panel from the supporting unit to the conveyor by the manipulator and transferring the display panel to the second transition chamber from the operating chamber by the conveyor when a vacuum degree of the second transition chamber is identical to that of the operating chamber; and
    transferring the display panel out of the second transition chamber.

15. The method according to claim 14, wherein the heating unit comprises a heating plate;
    the heating the display panel by the heating unit of the device comprises:
    directly contacting the heating plate with a region of the display panel corresponding to the integrated circuit in such a manner that the heating plate and the integrated circuit are located at two opposite sides of the display panel.

* * * * *

UNITED STATES PATENT AND TRADEMARK OFFICE
CERTIFICATE OF CORRECTION

PATENT NO.        : 9,987,836 B2  
APPLICATION NO.   : 14/742820  
DATED             : June 5, 2018  
INVENTOR(S)       : Yong Sun et al.

Page 1 of 1

It is certified that error appears in the above-identified patent and that said Letters Patent is hereby corrected as shown below:

In the Claims

Column 9, Line 18, Claim 14:  
After "panel,"  
Delete "to a".

Signed and Sealed this  
Thirtieth Day of October, 2018

Andrei Iancu  
*Director of the United States Patent and Trademark Office*